United States Patent [19]
Suzuki et al.

[11] Patent Number: 4,987,470
[45] Date of Patent: Jan. 22, 1991

[54] SEMICONDUCTOR DRAM DEVICE HAVING A TRENCH

[75] Inventors: Takaaki Suzuki, Kawasaki; Hiroshi Gotou, Niiza, both of Japan

[73] Assignee: Fujitsu Limited, Kawasaki, Japan

[21] Appl. No.: 297,470

[22] Filed: Jan. 17, 1989

[30] Foreign Application Priority Data

Jan. 21, 1988 [JP] Japan ................................. 63-9457
Jun. 2, 1988 [JP] Japan ............................. 63-134404

[51] Int. Cl.$^5$ .................... H01L 27/12; H01L 29/68; H01L 27/01; H01L 27/02
[52] U.S. Cl. ................................ 357/049; 357/23.6; 357/23.7; 357/51
[58] Field of Search ...................... 357/23.6, 23.7, 49, 357/51, 55

[56] References Cited

U.S. PATENT DOCUMENTS

3,811,076  5/1974  Smith, Jr. .............................. 357/41
3,841,926 10/1974  Garnache .......................... 357/23.3 X

FOREIGN PATENT DOCUMENTS

0221380A2  5/1987  European Pat. Off. .

OTHER PUBLICATIONS

"An Isolation-Merged Vertical Capacitor Cell for Large Capacity DRAM", Shigeru Nakajima et al., IEDM Tech. Dig., 1984, pp. 240–243.
"Electrical Characteristics of Isolation-Merged Vertical Capacitor (IVEC) Cell", T. Morie et al., 1985, Symposium on VLSI Technology, May 1985, pp. 88–89.

*Primary Examiner*—William Mintel
*Assistant Examiner*—Roy Potter
*Attorney, Agent, or Firm*—Armstrong, Nikaido, Marmelstein, Kubovcik & Murray

[57] ABSTRACT

A semiconductor device includes a semiconductor substrate having a trench and a transistor region around the trench, the transitor region including source and drain regions and a channel region above which a gate electrode is formed. An insulation film is formed so as to surround sidewalls of the trench. A conductive shield layer is formed along sidewalls of the first insulation film and is located under at least the gate electrode. A memory cell capacitor having first and second electrodes and an insulation film is interposed between the first and second electrodes formed in the trench. The first electrode is electrically connected to the drain region.

14 Claims, 11 Drawing Sheets

SEMICONDUCTOR DRAM DEVICE HAVING A TRENCH

BACKGROUND OF THE INVENTION

The present invention generally relates to a semiconductor device having a trench for use in isolation or capacitor formation and a method for producing the same, and in particular to a semiconductor device having an isolation-merged vertical capacitor cell, and a method for producing the same. More particularly, the present invention relates to a dynamic random access memory device having an improvement by which it becomes possible to prevent a leakage current due to the presence of a parasitic metal-oxide-semiconductor field effect transistor (MOSFET) formed in the memory device.

A dynamic random access memory (hereafter simply referred to as a DRAM) is classified into two types: one of which is a stacked type DRAM, and the other is an isolation-merged vertical capacitor cell type DRAM. Recently, as the integration density increases, there has been increased activity in the development of an isolation-merged vertical capacitor (hereafter simply referred to as an IVEC) cell type DRAM. In IVEC cell type DRAMs, a trench isolation is used for electrically isolating elements from each other, and a trench capacitor is used for storing a charge in a memory cell. The trench capacitor is formed so as to be buried in the trench. With this structure, it becomes possible to reduce the capacitor area and therefore the cell area.

It is known that conventional IVEC cell type DRAMs have a problem in which a parasitic MOS transistor is formed along a sidewall of a transistor region which is formed around trench isolations and has source and drain regions. This is also called a parasitic sidewall MOSFET. The parasitic MOS transistor causes a leakage current to pass through a sidewall portion of a channel formed in the transistor region. Such a sidewall portion of the channel is also called a parasitic sidewall channel. The above-mentioned problems have been reported in the following two papers: (1) S. Nakajima, et al., "AN ISOLATION-MERGED VERTICAL CAPACITOR CELL FOR LARGE CAPACITOR DRAM", IEDM Tech. Dig., 1984, pp. 240-243; (2) T. Morie et al., "ELECTRICAL CHARACTERISTICS OF ISOLATION-MERGED VERTICAL CAPACITOR (IVEC) CELL", 1985 Symposium on VLSI Technology, May 1985, pp. 88-89.

These papers disclose that to prevent the leakage current from passing through the parasitic sidewall channel, parasitic sidewall MOSFET gate oxide thickness, transfer MOSFET gate oxide thickness and channel impurity concentration are optimized. However, the above-mentioned proposal cannot greatly reduce the leakage current. It is noted that the papers disclose a storage electrode of the IVEC formed around the transistor region. This arrangement of the storage electrode increases capacitance of the IVEC. However, a large amount of leakage current may be induced.

SUMMARY OF THE INVENTION

It is therefore a general object of the present invention to provide a novel and useful semiconductor device having a trench in which the above-mentioned disadvantages are eliminated.

A more specific object of the present invention is to provide a semiconductor device having a trench in which the leakage current is prevented from passing through the parasitic sidewall channel.

Another object of the present invention is to provide a semiconductor device having a trench in which in addition to suppression of the leakage current, an increased capacitance of the IVEC can be obtained.

The above objects of the present invention can be achieved by a semiconductor device having a trench including a semiconductor substrate having a trench and a transistor region around the trench, the transistor region comprising source and drain regions and a channel region above which a gate electrode is formed. An insulation film is formed so as to surround sidewalls of the trench. A conductive shield layer is formed along sidewalls of the first insulation film and is located under at least the gate electrode. A memory cell capacitor having first and second electrodes and an insulation film is interposed between the first and second electrodes formed in the trench. The first electrode is electrically connected to the drain region.

Another object of the present invention is to provide a method for producing the above-mentioned semiconductor device having a trench.

The above another object of the present invention can be achieved by a method comprising the steps of forming a trench and a transistor region around the trench in a semiconductor substrate, the transistor region comprising source and drain regions; forming a first insulation film around sidewalls of the transistor region; forming a shield layer along the first insulation film, the shield layer comprising a conductive material; forming a second insulation film in the trench; forming a first electrode of a memory cell capacitor along the second insulation film so as to be connected to the drain region; forming a third insulation film around the first electrode; and forming a second electrode of the memory cell capacitor around the third insulation film in the trench.

Other objects, features and advantages of the present invention will become apparent from the following detailed description when read in conjunction with the accompanying drawings.

DETAILED DESCRIPTION

Figure 1:
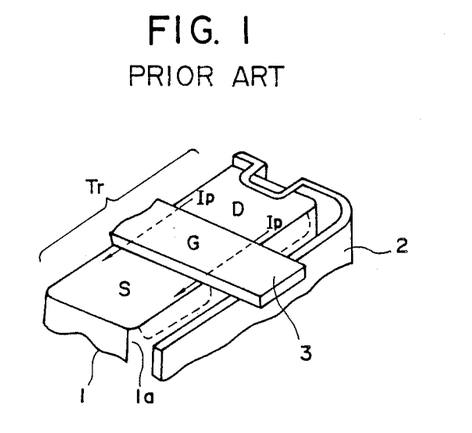
FIG. 1 is a perspective view of a conventional dynamic random access memory device having the IVEC cell structure.
Figure 2:
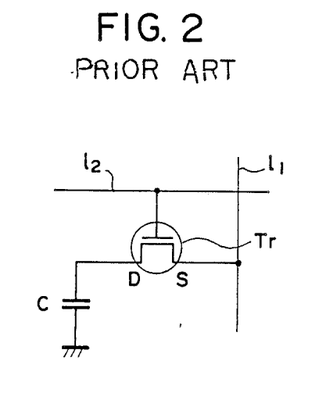
FIG. 2 is a circuit diagram of the DRAM cell shown in FIG. 1.
Figure 3:
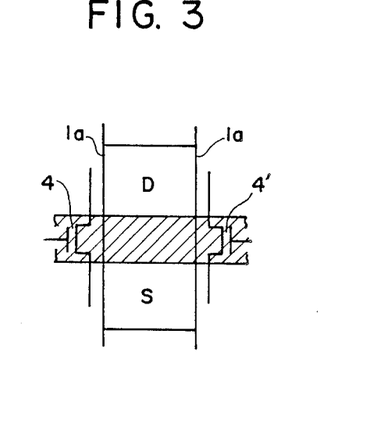
FIG. 3 is a view illustrating the parasitic MOSFET.

Before describing the preferred embodiments of the present invention, a further description is given of a conventional DRAM device of the IVEC cell structure with reference to FIGS. 1 through 3.

Referring to FIG. 1, a trench is formed around a transistor region Tr including source and drain regions S and D formed in a silicon substrate 1. An insulation film (not shown) is formed so as to surround sidewalls 1a of the transistor region Tr. Outside the insulation film, a storage electrode 2 of an IVEC is formed so as to be arranged around the transistor region Tr and be in contact with the drain region D. This arrangement of the storage electrode 2 contributes to an increase in capacitance of the IVEC. The storage electrode 2 is surrounded by a capacitor insulation film (not shown), which is surrounded by an opposed electrode of the IVEC formed in the trench. As described above, the IVEC for storing a charge is formed so as to be buried into the trench for isolation between elements. Between the source and drain regions S and D, a gate electrode 3 is formed on a gate insulation film (not shown) formed on the surface of the silicon substrate 1.

With the above structure, as shown in FIG. 2, there is formed a memory cell consisting of a transfer MOSFET Tr and a capacitor C. A DRAM device comprises a plurality of such memory cells arrays. Sources of transfer MOSFETs are connected to related bit lines such as a bit line $1_1$, and gates thereof are connected to related word lines such as a word line $1_2$.

However, as shown in FIG. 3, parasitic MOSFETs 4 and 4' are formed due to the presence of the storage electrode 2 formed along the insulation film around the sidewalls 1a of the transistor region Tr. A parasitic MOSFET is also formed by the combination of the gate electrode 3 and the sidewall 1a of the transistor region Tr. When the potential of the storage electrode 2 is relatively low, there is less problem. On the other hand, when the potential of the storage electrode 2 is relatively high (generally 3.5 to 5 volts; 7 volts at maximum), the parasitic MOSFETs 4 and 4' may conduct. In this case, the storage electrode 2 functions as gates of the parasitic MOSFETs. Thereby, as shown in FIG. 1, the leakage currents Ip pass through parasitic sidewall channels formed along the sidewalls of the transistor region Tr. In order to increase capacitance of the IVEC, the storage electrode 2 is arranged around the transistor region Tr. However, it is noted that this arrangement induces a large amount of leakage current Ip.

The present invention aims to prevent the occurrence of the leakage current due to the presence of the parasitic MOSFETs.

Figure 4:
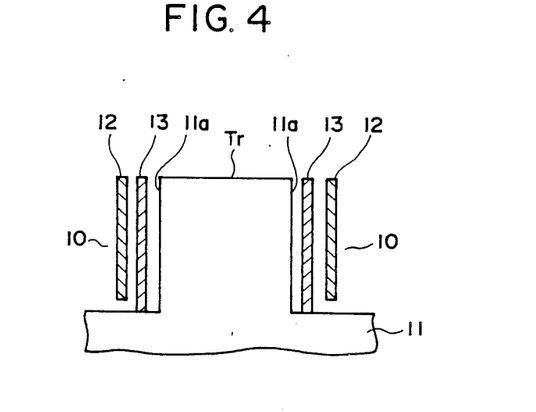
FIG. 4 is a view illustrating the principle of the present invention.

FIG. 4 illustrates the principle of the present invention. Referring to FIG. 4, trenches 10 are formed in a semiconductor substrate 11. A transistor region Tr is formed so as to be surrounded by the trench 10. Shield layers 13 made of a conductive material are interposed between sidewalls 11a of the semiconductor substrate 11 and conductive films 12 such as storage electrodes of the IVEC. INsulation films (not shown) are interposed between the sidewalls 11a and the shield layers 13 and between the shield layers 13 and the conductive films 12. The shield layers 13 are connected to the silicon substrate 11 at bottom surfaces of the trenches 10. Thereby, the potential of the shield films 12 is kept identical to that of the substrate 11. As a result, even when a high voltage is applied to the shield layers 13, the parasitic MOSFETs having gates of the conductive films 12 cannot conduct, and therefore the leakage current does not occur. In place of the connection of the shield layers 13 with the semiconductor substrate 11, it is possible to connect the shield layers 13 to gate electrodes (not shown) or be kept in the floating state. These structures will be described in detail later.

Figure 5:
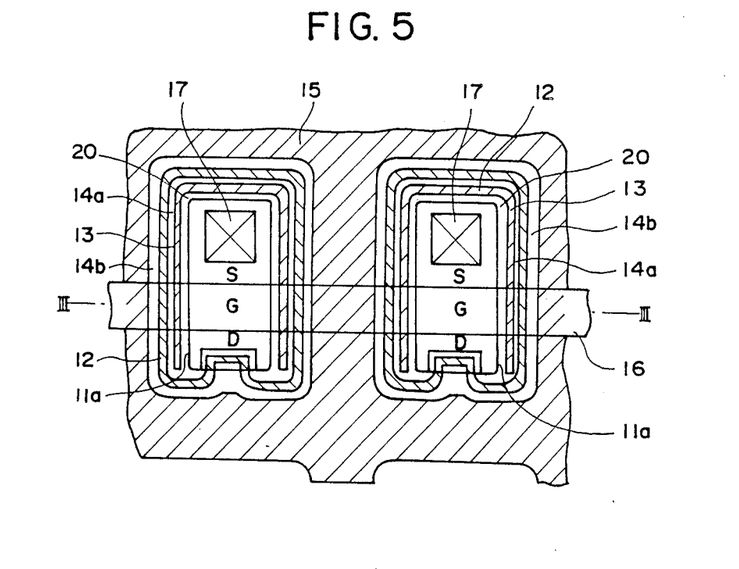
FIG. 5 is a plan view of a preferred embodiment of the present invention.
Figure 6:
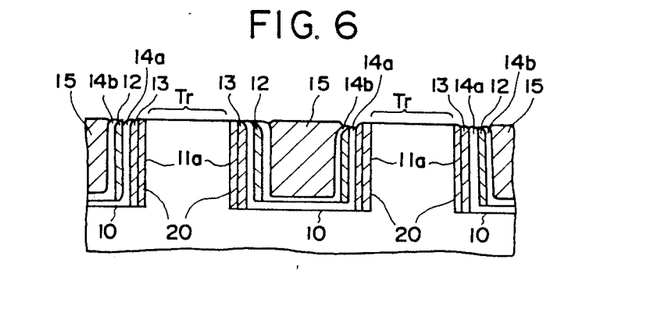
FIG. 6 is a cross sectional view taken along a line III—III shown in FIG. 5.

A description is given of a preferred embodiment of the present invention with reference to FIGS. 5 and 6. In FIGS. 5 and 6, those parts which are the same as those in FIG. 4, are given the same reference numerals in FIG. 4.

Referring to FIGS. 5 and 6, trenches 10 are formed in a p-type silicon substrate 11 so as to be arranged around MOSFET regions (hereafter referred to as transistor regions) Tr. Each transistor region Tr has source and drain regions which are formed by diffusing an n+-type impurity such as arsenic (As) into the p-type silicon substrate 11. The following description is given with respect to one of the IVEC cells. Sidewalls 11a of the transistor region Tr are surrounded by an insulation film 20 formed in the trench 10. A shield layer 13 having a U-shaped structure is formed outside the insulation film 20 so as to surround the transistor region Tr. As clearly shown in FIG. 6, the shield layer 13 is made of a conductive material, and is electrically connected to the p-type silicon substrate 11. A capacitor insulation film 14a is formed around the shield layer 13. A storage electrode 12 is formed in the trench 10 so as to be arranged along sidewalls 11a of the transistor region Tr. The storage electrode 12 is connected to drain region D formed in the transistor region Tr, as shown in FIG. 5. The storage electrode 12 is surrounded by a capacitor insulation film 14b (which is also called a dielectric film). An opposed electrode 15 is formed outside the capacitor insulation film 14b. On the surface of the silicon substrate 11, an insulation film (not shown) is formed, on which a gate electrode 16 served as a word line is formed. An ohmic contact 17 is formed in the source region S, whereby the source region S is connected to a related bit line (not shown).

A description is given of a process for producing the device shown in FIGS. 5 and 6 with reference to FIGS. 7A through 7G.

Figure 7A:
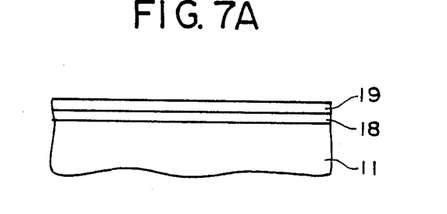
FIGS. 7A through 7G are cross sectional views illustrating different steps of the process for producing the embodiment shown in FIGS. 5 and 6.

Referring to FIG. 7A, on the main surface of the p-type silicon substrate 11, an initial silicon dioxide film 18 is formed by a thermal oxidation process to a thickness of approximately 300 Å. Then a silicon nitride film 19 having a thickness of about 1000 " is formed on the initial silicon dioxide film 18 by chemical vapor deposition.

Figure 7B:
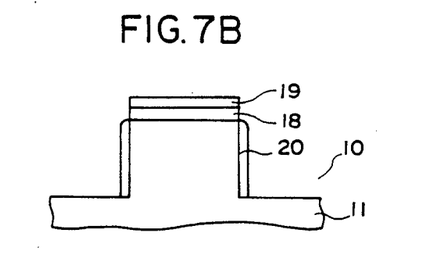

Next, as shown in FIG. 7B, the initial silicon dioxide film 18 and the silicon nitride film 19 are patterned so as to remain on the transistor region Tr by the conventional photolithography technique. Then by using the patterned initial silicon dioxide film 18 and silicon nitride film 19 as a mask, the silicon substrate 11 is etched so that the trench 10 is formed around the transistor region Tr. Thereafter, the silicon substrate 11 is subjected to the thermal oxidation process so that a silicon dioxide film is formed on the exposed surface thereof. Then the silicon dioxide film is subjected to an anisotropic etching such as reactive ion etching. Thereby, the thin silicon dioxide film 20 having a thickness of approximately 1000 Å is left along the sidewalls 11a of the transistor region Tr within the trench 10.

Figure 7C:
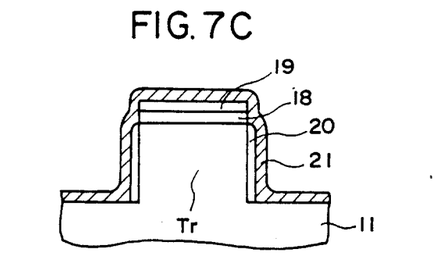

Then, as shown in FIG. 7C, a polysilicon film 21 doped with a p-type impurity such as boron in its entirety, is deposited on the entire surface to a thickness of approximately 300 Å to 1 μm. The doping of the p-type impurity is carried out by ion implantation with a dose of $1 \times 10^{15}$ cm$^{-2}$, for example.

Figure 7D:
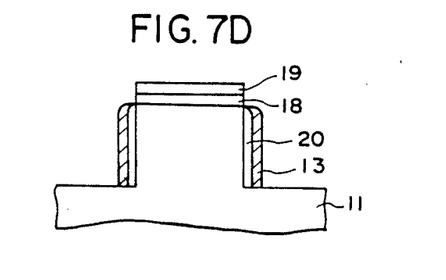

Subsequently, as shown in FIG. 7D, after placing a mask film on the entire surface, the polysilicon film 21 is etched by reactive ion etching so as to be left on the silicon dioxide film 20. The remaining polysilicon film 21 is served as the shield layer 13. The lowermost end of the shield layer 13 is electrically connected to the silicon substrate 11.

Figure 7E:
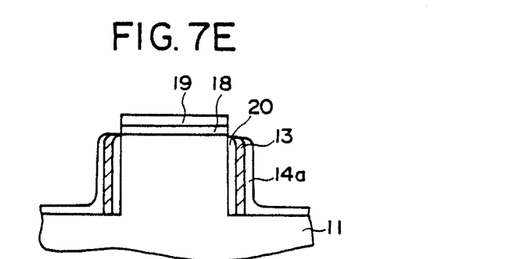

Then, as shown in FIG. 7E, a silicon dioxide film having a thickness of approximately 500 Å is formed on and along the inner surfaces of the trench 10. This silicon dioxide film is the capacitor insulation film 14a.

Figure 7F:
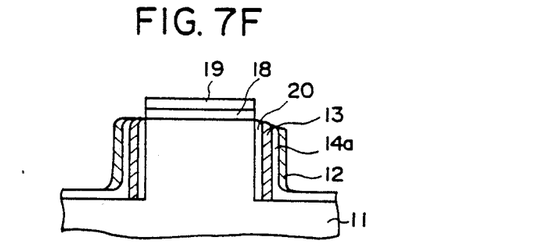

Then, as shown in FIG. 7F, a polysilicon film is deposited on the entire surface to a thickness of approximately 1500 Å, and is then etched by reactive ion etching so as to be left along the vertical wall of the capacitor insulation film 14a. The left polysilicon film is the storage electrode 12 of the IVEC. It is preferable to over-etch the polysilicon film so that the top end of the shield layer 13 is higher than the top end of the storage electrode 12. By this structure, it becomes possible to enhance the shield effect provided by the shield layer 13.

Figure 7G:
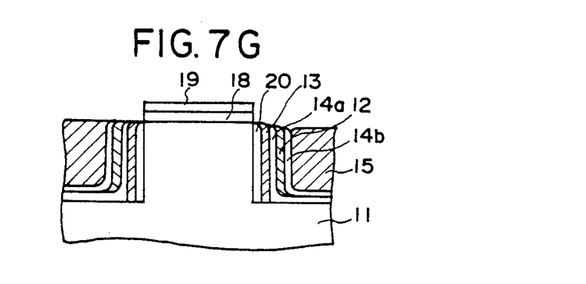

Then, as shown in FIG. 7G, the capacitor insulation film 14b of silicon dioxide having a thickness of approximately 500 Å is formed on and along the inner surfaces of the trench 10. After that, polysilicon is deposited so as to fill the trench 10. The polysilicon film thus formed constitutes the opposed electrode 15.

The step of FIG. 7G is followed by conventional steps. For example, a wet silicon dioxide film is deposited to a thickness of approximately 3000 Å. Then the silicon nitride film 19 is removed by etching. Thereafter, a gate insulation film is formed on the surface of the silicon substrate 11, and then the gate electrode 16 is formed by depositing a polysilicon film and then patterning the same. Finally, the source and drain regions are formed by implanting an n-type impurity such as arsenic by the self-alignment process.

In the memory cell of the IVEC cell structure thus formed, the shield layer 13 has the potential identical to the silicon substrate 11. Therefore, even when a relatively high voltage is applied to the storage electrode 12, the parasitic MOSFETs (made up of a portion of the channel region in the transistor region Tr and the storage electrode 12) are prevented from conducting. As a result, the leakage currents are prevented from passing through the channel region in the transistor region Tr along the sidewalls thereof. Normally, the silicon substrate 11 is biased to approximately −2 to −3 volts, the shield effect provided by the shield layer 13 is facilitated. Additionally, since the storage electrode 12 is arranged around the transistor region Tr, a large amount of capacitance of the IVEC is obtainable. The above-mentioned structure of the IVEC cell should be appreciated in view of an increased capacitance and no leakage current.

Figure 8:
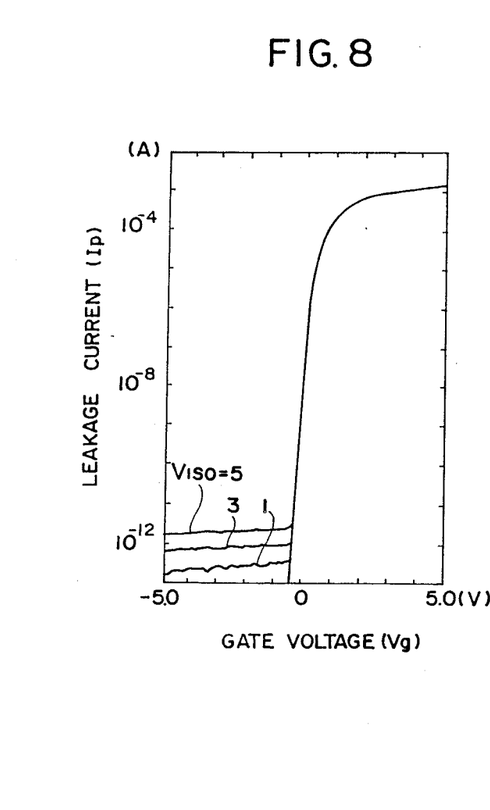
FIG. 8 is a graph showing a leakage current versus a gate current with respect to the embodiment shown in FIGS. 5 and 6.
Figure 9:
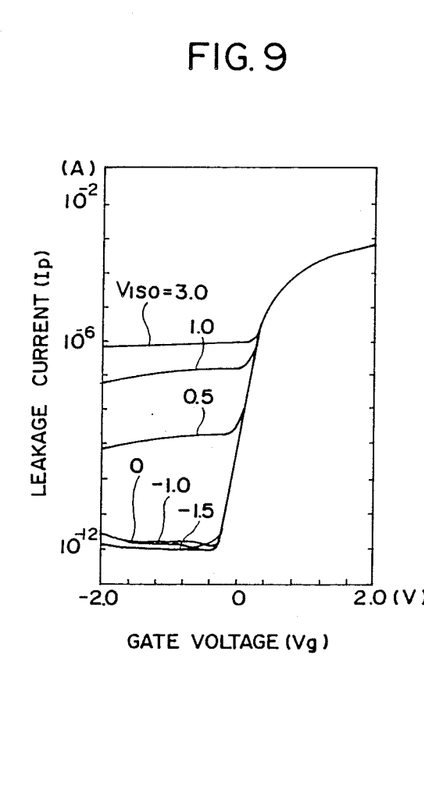
FIG. 9 is a graph showing the leakage current versus the gate current with respect to the conventional DRAM device shown in FIG. 1.

FIG. 8 is a graph showing the leakage current measured in a DRAM cell having the above-mentioned structure of the present invention. FIG. 9 is a graph showing the leakage current measured in the conventional DRAM cell having no shield layer. In each of the figures, the horizontal axis represents the gate voltage (Vg) applied to the gate electrode such as 16 (FIG. 5) and 3 (FIG. 1), and the vertical axis logarithmically represents the leakage current (Ip). The leakage current Ip as a function of the gate voltage Vg was measured for various values of the voltage ($V_{ISO}$) which is applied to the storage electrode 12. With a voltage of 3 volts applied to the storage electrode 12, the leakage current Ip with respect to the cell structure of the present invention is approximately 1 pA ($10^{-12}$A), whereas the leakage current Ip with respect to the conventional cell structure is approximately 1 μA ($10^{-6}$A).

Figure 10:
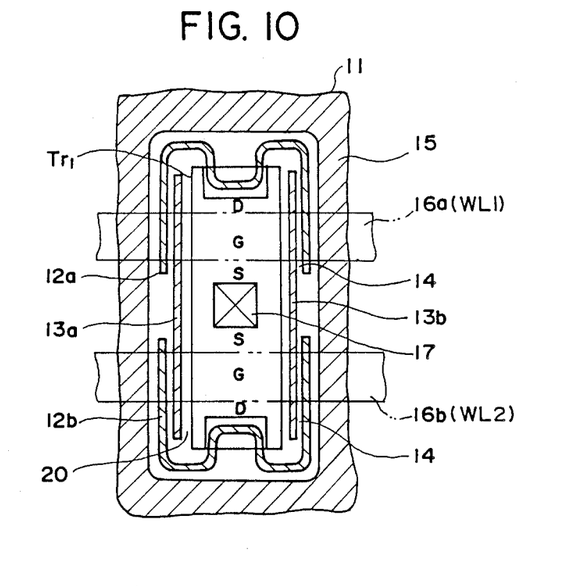
FIG. 10 is a plan view of another preferred embodiment of the present invention.

Another preferred embodiment of the present invention is described with reference to FIG. 10. In FIG. 10, those parts which are the same as those in the previous figures, are indicated by the same reference numerals. Referring to FIG. 10, the trench is formed in the silicon substrate 11 so as to be arranged around a transistor region Tr$_1$. In the transistor region Tr$_1$, there are formed two transfer MOS transistors, which have a common source region S. Therefore, the single ohmic contact 17 is formed in the common source region S. Storage electrodes 12a and 12b are formed so as to be arranged along sidewalls of respective transistor formation portions formed in the transistor region Tr$_1$. The storage electrodes 12a and 12b are connected to the respective drain regions D. A capacitor insulation film 14 is formed so as to surround the storage electrodes 12a and 12b. The opposed electrode 15 is formed in the trench so as to surround the capacitor electrode 14. Shield layers 13a and 13b are formed along the long sidewalls of the transistor region Tr$_1$, and are interposed between the transistor region Tr$_1$ and the storage electrodes 12a and 12b. The insulation film 20 is interposed between the sidewalls of the transistor region Tr$_1$ and the shield layers 13a and 13b. The shield layers 13a and 13b are connected to the silicon substrate 11 at bottom portions of the trench. Gate electrodes 16a and 16b (or word lines WL1 and WL2) are formed on a gate insulation film (not shown) formed on the surface of the silicon substrate 11. The structure of FIG. 10 may be produced by a process similar to the process illustrated in FIGS. 7A through 7G. It can be seen from the above description that the occurrence of the leakage current is prevented due to the presence of the shield layers 13a and 13b.

Figure 11:
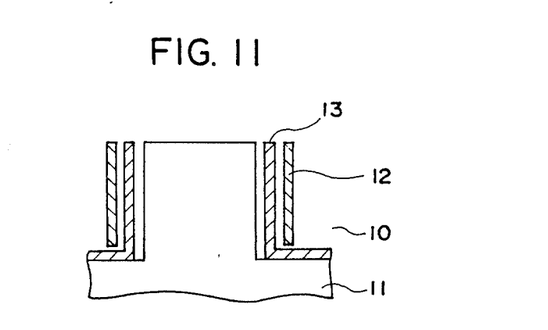
FIG. 11 is a view illustrating a variation of the embodiments shown in FIGS. 3 and 4 and FIG. 10.

A variation of the above-mentioned embodiments is described. As described previously by referring to FIGS. 7C and 7D, the shield layer 13 connected to the silicon substrate 11 is formed by removing the portion of the polysilicon film 21 which overlies the bottom surface of the trench 10. In the alternate, as shown in FIG. 11, it is also possible to leave the portion of the polysilicon film 21 which overlies the bottom surface of the silicon substrate 11. With this structure, it becomes possible to obtain a better contact between the shield layer 13 and the silicon substrate 11. Of course, it is preferable that the shield layer 13 is doped with an impurity of the same conductive type as that of the silicon substrate 11.

Figure 12:
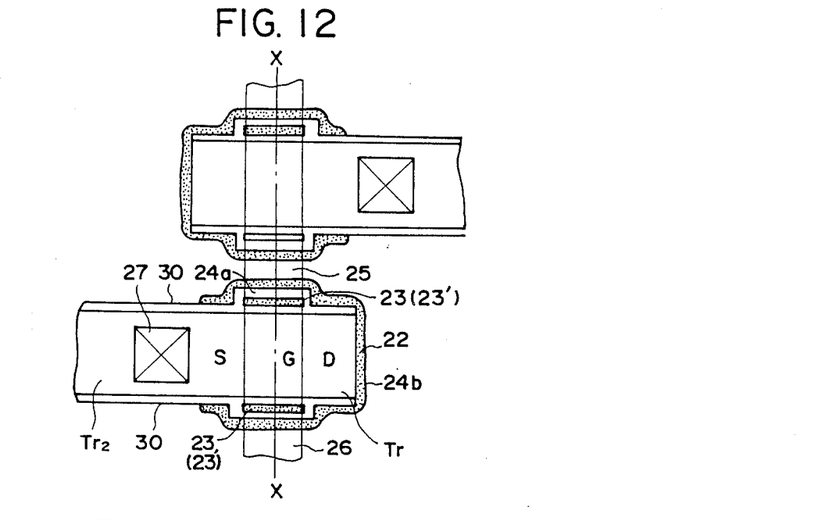
FIG. 12 is a plan view of still another preferred embodiment of the present invention.
Figure 13A:
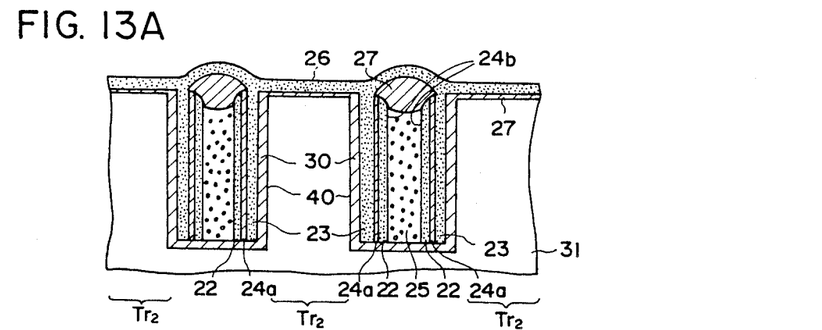
FIGS. 13A and 13B are cross sectional views taken along a line X—X shown in FIG. 12.

A description is given of still another embodiment with reference to FIG. 12 and FIG. 13A. The embodiment shown in FIGS. 12 and 13A has the following features. First, shield layers 23 are formed only along the channel region in the transistor region Tr. In other words, the shield layers 23 are formed only under a gate electrode (a word line) 26. With this structure, it is possible to prevent leakage currents due to parasitic MOSFETs having the gate electrode 26 from passing through the channel. Secondly, the shield layers 23 are connected to the gate electrode 26. The following description is given one of the IVEC cells.

A trench 40 is formed in a p-type silicon substrate 31. An insulation film 30 made of a silicon dioxide for example, is formed on sidewalls of the trench 40. The insulation film 30 is connected to a gate insulation film 27 formed on the main surface of the transistor regions Tr$_2$. The shield layers 23 are formed in the vicinity of the channel region along the opposite sidewalls of the transistor region Tr$_2$. The shield layers 23 are electrically connected to the gate electrode 26 formed on the gate insulation film 27. An insulation film 24a made of silicon dioxide for example, is covered with the peripheral walls of the shield layers 26. A storage electrode 22 made of polysilicon for example, is formed so as to surround the shield layers 23 covered with the insulation layer 24a. A capacitor insulation film 24b is formed around the storage electrode 22. An opposed electrode 25 is filled in the trench 40. The above-described gate electrode 27 is also formed on the capacitor insulation films 24a and 24b, the storage electrode 22 and the opposed electrode 25.

In practical use, voltages of about 0 volt and about 5 volts are alternatively applied to the gate electrode 26. Therefore, the shield layers 23 are alternatively supplied with voltages of about 0 volt and about 5 volts. As a result, each time when a voltage of 0 volt is applied to the gate electrode 26, an interface between each of the shield layers 23 and the capacitor insulation film 24a is set to a negative voltage. Consequently, it becomes possible to prevent the parasitic MOSFETs formed under the gate electrode 26 from conducting.

Figure 13B:
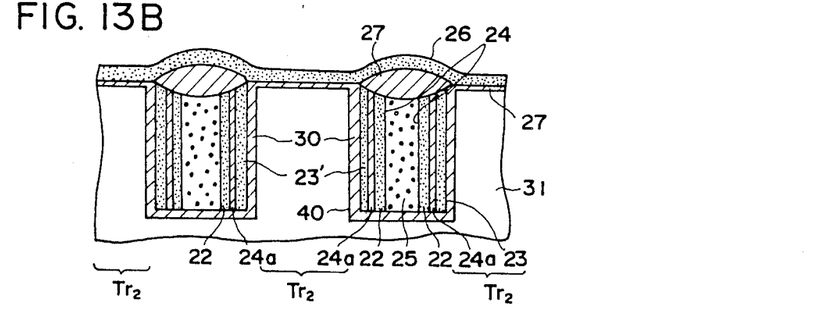

FIG. 13B is a cross sectional view of a further embodiment taken along the line X—X shown in FIG. 12. The embodiment of FIG. 13B has the feature in which the gate insulation film 27 is formed on the shield layers 23 shown in FIG. 13A in addition to the capacitor insulation films 24a and 24b, the storage electrode 22 and the opposed electrode 25. Hereafter, the shield layers shown in FIG. 13B are indicated by a reference numeral 23'. It is noted that the shield layers 23' are kept in the floating state. Normally, bit lines of DRAMs have a refresh period on the order of milliseconds. In the embodiment of FIG. 13B, a pulse is applied across the opposed electrode 25 and bit lines during a period of approximately 1 μm. By the application of the pulse, negative charges are stored in the shield layers 23'. Therefore, it becomes possible to prevent the parasitic MOSFETs from conducting and additionally increase the threshold voltage of the transfer MOS transistor. For example, it is possible to increase the threshold voltage by approximately 0.2 volts each time when a p-type silicon of a resistivity of 10 Ω cm is supplied with 10 charges per square centimeters. The structure of FIG. 13B needs an additional pulse supplying circuit for applying the above-mentioned pulse across the opposed electrode 25 and bit lines. However, it is advantageous to control the potential of the shield layers 23' to some extent and thereby control the shield effect provided by the shield layers 23'.

A description is given of the process for producing the embodiment of FIG. 12 and 13A with reference to 14A through 14I.

Figure 14A:
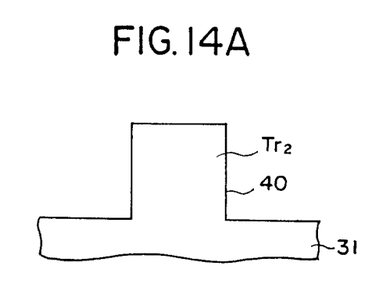
FIGS. 14A through 14I are cross sectional views showing different steps of the process for producing the embodiment of FIG. 13A.

Referring to FIG. 14A, the above-described initial silicon dioxide film and the silicon nitride film are deposited on the p-type silicon substrate 31, and are patterned so as for the transistor region Tr$_2$ to be defined. Then by using the patterned initial silicon dioxide film and silicon nitride film as a mask, the silicon substrate 31 is patterned so as to form the trench 40 around the transistor region Tr$_2$.

Figure 14B:
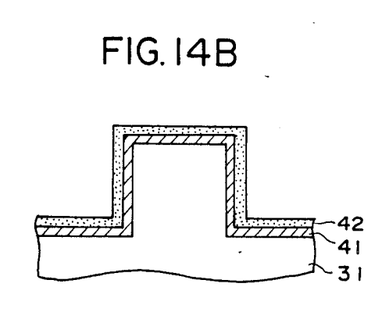

After removing the mask by etching, as shown in FIG. 14B, an insulation film 41 of silicon dioxide is grown to a thickness of approximately 2000 Å by the thermal oxidation process. Subsequently, a polysilicon film 42 is deposited to a thickness of 300Å to 1 μm by chemical vapor deposition.

Figure 14C:
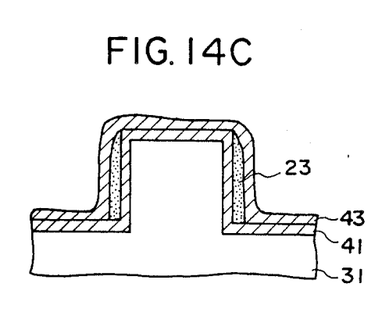

Then, a resist mask corresponding to the shape of the shield layers 23 is placed on the entire surface. Thereafter, as shown in FIG. 14C, the polysilicon film 42 is removed by reactive ion etching so as to leave a portion thereof under the gate electrode 26. The remaining polysilicon portion is the shield layers 23. Then, as shown in FIG. 14C, a silicon nitride film 43 is deposited to a thickness of 200 to 1000 Å.

Figure 14D:
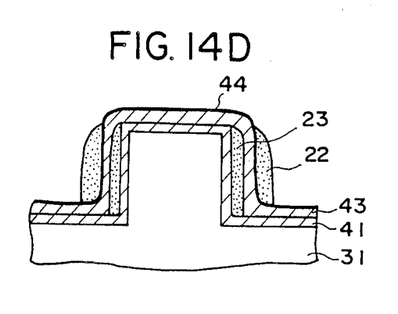

Then, as shown in FIG. 14D, the silicon nitride film 43 is subjected to the thermal oxidation process so as to form a thin silicon dioxide film 44 to a thickness of 100 to 500 Å. This silicon dioxide film 44 is used for reinforcing insulation properties provided by the silicon nitride film 43. Thereafter, a polysilicon film is deposited to a thickness of 300 to 2000 Å by chemical vapor deposition, and is then etched by reactive ion etching in which a mask film corresponding to the storage electrode 22 is used. The remaining polysilicon film is the storage electrode 22.

Figure 14E:
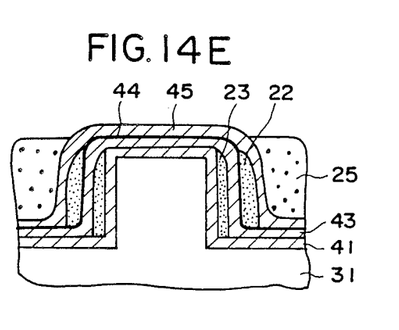

Then, as shown in FIG. 14E, a silicon dioxide film 45 is grown to a thickness of 500 to 3000 Å by the thermal oxidation process. Subsequently, a polysilicon film having a thickness of 1 to 5 μm is deposited to the entire surface by chemical vapor deposition, and is partially removed by the etch back process so that the polysilicon film remains only in the trench 40. The remaining polysilicon film is the opposed electrode 25.

Figure 14F:
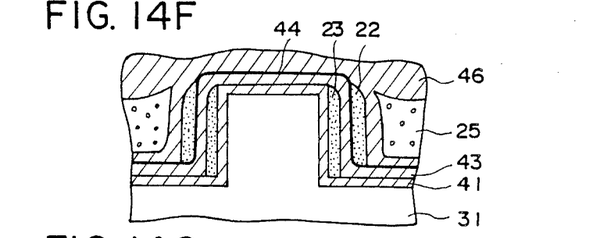

Then, as shown in FIG. 14F, a silicon dioxide film 46 which is 4000 Å to 1 μm thick, is formed by subjecting the entire surface to the thermal oxidation process (field oxidation).

Figure 14G:
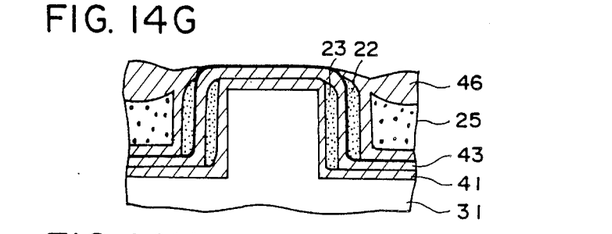
Figure 14H:
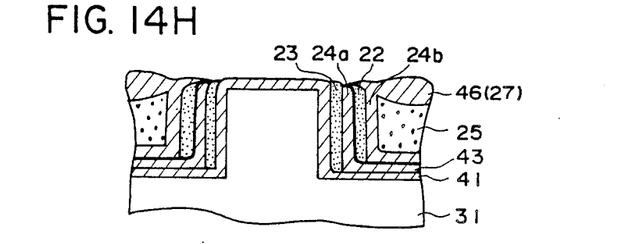

Then, as shown in FIG. 14G, the silicon dioxide film 46 is partially removed by reactive ion etching so as to expose the surface of the silicon nitride film 43. The left silicon dioxide film 46 is served as the gate insulation layer 27 formed on the capacitor insulation films 24a and 24b, the storage electrode 22 and the opposed electrode 25 shown in FIGS. 12 and 13A.

Figure 14I:
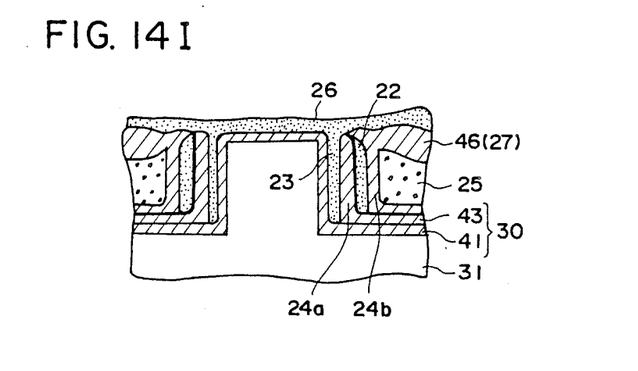

Finally, as shown in FIG. 14I, a polysilicon film is deposited and is then patterned so as to obtain the gate electrode 26. It is noted that the shield layers 26 are electrically connected to the gate electrode 26.

Figure 15A:
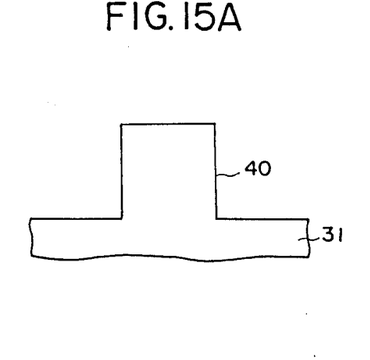
FIGS. 15A through 15I are cross sectional views showing different steps of the process for producing the embodiment of FIG. 13B.
Figure 15B:
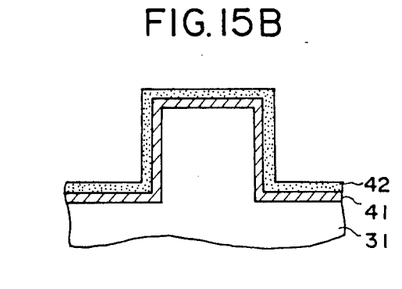

A description is given of the process for producing the embodiment shown in FIGS. 12 and 13B with reference to FIGS. 15A through 15I. Steps shown in FIGS. 15A and 15B are the same as those shown in FIGS. 14A and 14B.

Figure 15C:
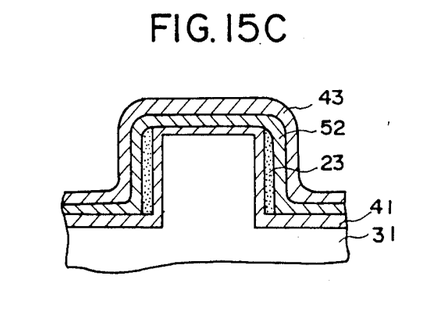
Figure 15D:
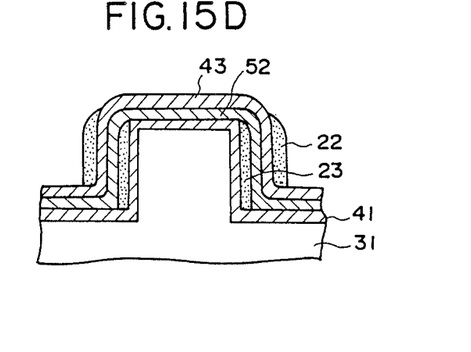
Figure 15E:
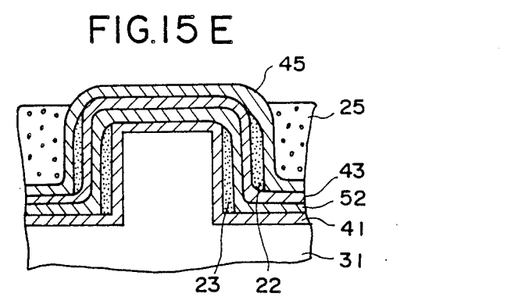
Figure 15F:
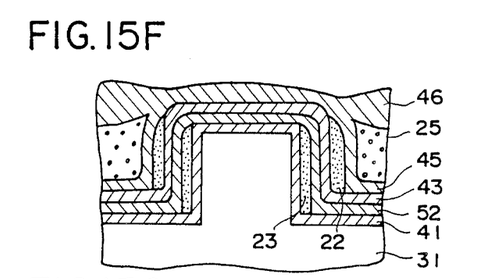
Figure 15G:
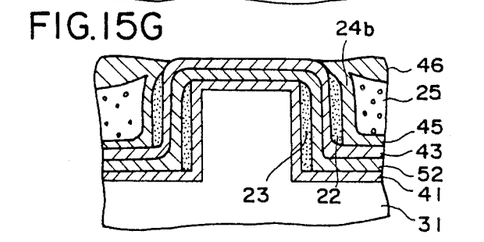

Referring to FIG. 15C, a silicon dioxide film 52 is deposited to a thickness of 200 to 1000 Å by chemical vapor deposition. Subsequently, the above-mentioned silicon nitride film 43 is deposited on the silicon dioxide film 52 to a thickness of 200 to 1000 Å by chemical vapor deposition. Steps shown in FIGS. 15D through 15G are the same as those shown in FIGS. 14D through 14G.

Figure 15H:
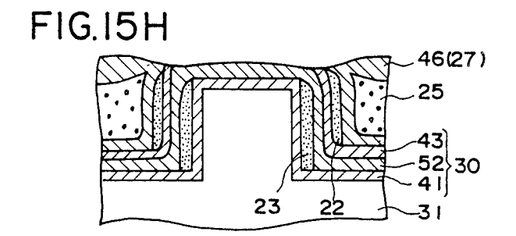
Figure 15I:
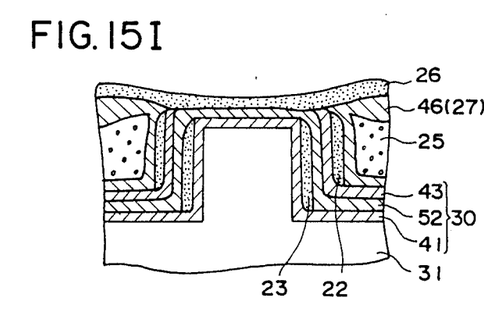

Then, as shown in FIG. 15H, the silicon nitride film 43 is removed by reactive ion etching so as to expose the surface of the silicon dioxide film 52. Finally, as shown in FIG. 15I, a polysilicon film is deposited on the entire surface, and is then patterned so that the gate electrode 26 is formed.

It is noted that the shield layers 23 are totally covered with the insulation films 41 and 53, and are therefore kept in the floating state.

In the above-mentioned embodiments, the silicon substrate is of the p-type. In the alternative, it is possible to use an n-type silicon substrate. In this case, it is preferable that shield layers are doped with an n-type impurity.

The present invention is not limited to the aforementioned embodiments, and variations and modifications may be made without departing from the scope of the present invention.

What is claimed is:

1. A semiconductor device having a trench comprising:
    a semiconductor substrate having a trench and a transistor region surrounded by said trench, said transistor region comprising source and drain regions and a channel region above which a gate electrode is formed;
    a first insulation film surrounding sidewalls of said trench;
    a shield layer formed along sidewalls of said first insulation film and located under at least said gate electrode, said shield layer comprising a conductive material; and
    a memory cell capacitor having first and second electrodes and a second insulation film interposed between said first and second electrodes formed in said trench, said first electrode being electrically connected to said drain region.

2. A semiconductor device as claimed in claim 1, wherein said shield layer is electrically connected to said semiconductor substrate.

3. A semiconductor device as claimed in claim 1, wherein said shield layer is electrically connected to said gate electrode.

4. A semiconductor device as claimed in claim 1, wherein said shield layer is electrically insulated from said gate electrode, and said first and second electrodes, so that said shield layer is kept in a floating state 5. A semiconductor device as claimed in claim 2, wherein said shield layer is electrically connected to said semiconductor substrate at a bottom surface of said trench.

6. A semiconductor device as claimed in claim 5, wherein said shield layer totally overlies the bottom surface of said trench.

7. A semiconductor device as claimed in claim 1, wherein said shield layer has a U-shaped structure, and is formed so as to partly surround said transistor region.

8. A semiconductor device as claimed in claim 1, wherein said shield layer comprises two shield layer portions which are arranged along opposite sidewalls of said transistor region.

9. A semiconductor device as claimed in claim 4, wherein a pulse is applied for every predetermined period across said source region and said second electrode of said memory capacitor cell.

10. A semiconductor device as claimed in claim 1, wherein said shield layer comprises polysilicon.

11. A semiconductor device as claimed in claim 10, wherein said shield layer is doped with an impurity of a conductive type identical to that of said semiconductor substrate.

12. A semiconductor device as claimed in claim 1, wherein said shield layer is approximately 300 Å to approximately 1 μm thick.

13. A semiconductor device as claimed in claim 1, wherein said transistor region comprises two transistor forming portions, and commonly has the source region.

14. A semiconductor device as claimed in claim 1, wherein said first and second electrodes are storage and opposed electrodes.

* * * * *